United States Patent [19]
Dent

[11] Patent Number: 5,097,222
[45] Date of Patent: Mar. 17, 1992

[54] DIGITAL ANALOG SIGNAL DEMODULATOR

[75] Inventor: Peter R. Dent, Bedford, England

[73] Assignee: Texas Instruments Incorporated, Dallas, Tex.

[21] Appl. No.: 732,737

[22] Filed: Jul. 18, 1991

Related U.S. Application Data

[63] Continuation of Ser. No. 621,477, Dec. 3, 1990, abandoned.

[51] Int. Cl.$^5$ .............................................. H03D 1/00
[52] U.S. Cl. ................................ 329/347; 329/353; 329/363
[58] Field of Search ............... 329/347, 349, 353, 363; 375/103

[56] References Cited

U.S. PATENT DOCUMENTS 4,298,985  11/1981  Ballard et al. ............... 375/103 X
4,989,219  1/1991  Gerdes et al. ............... 329/363 X Primary Examiner—Robert J. Pascal
Attorney, Agent, or Firm—Richard Donaldson; Rene Grossman; James F. Hollander

[57] ABSTRACT

There is disclosed a system and method for demodulating an analog signal using digital conversion of the analog signal. In one embodiment the incoming modulated signal is digitally sampled and a calculation is made as to both the short term and long term energy of the digitized version of the analog signal. The deviation between the short and long term energy levels is used to determine the amount of modulation of the incoming analog signal. An analog demodulated signal is then reconstructed from the digitized deviation calculations. In an alternate embodiment, a digital signal processor is used to derive the demodulated signal.

21 Claims, 3 Drawing Sheets

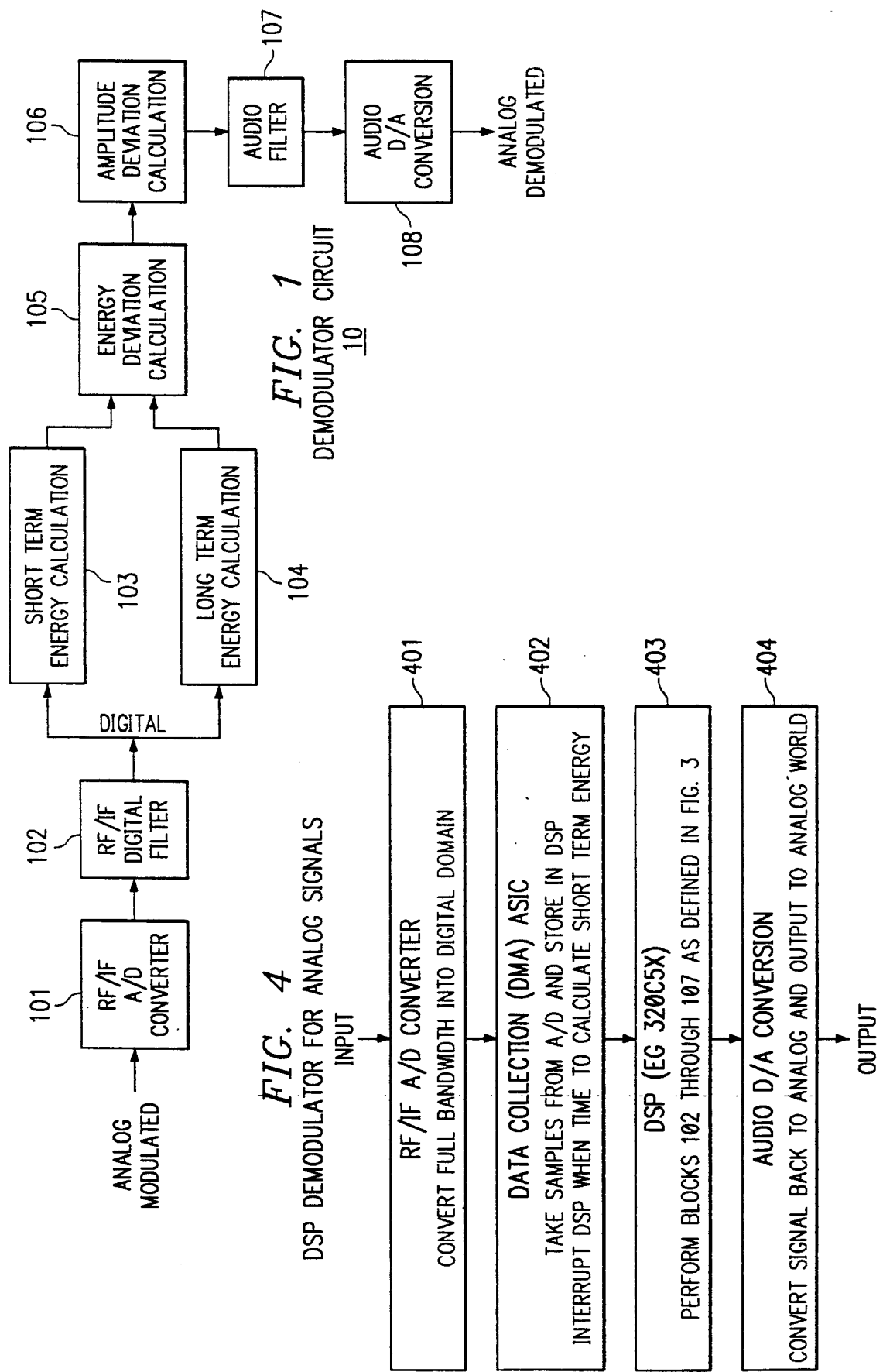

FIG. 2
TYPICAL CALCULATIONS

EQUATION FOR AMPLITUDE MODULATION IS:—

$$\text{Signal} = (1 + m \cos w_m t) \cdot \cos w_c t \qquad [1] \text{ (Textbook)}$$

WHERE m IS THE MODULATION INDEX. THE ENERGY IS THEREFORE $$\text{Energy} = (1 + m \cos w_c t)^2 \cdot \cos^2 w_m t \qquad [2] \text{ (Squaring)}$$

IN THE LONG TERM $(1 + m \cos w\, t)$ AVERAGES AT ONE THEREFORE $$\text{Energy}_{lt} = \cos^2 w_c t \qquad [3] \text{ (Long term average)}$$

IN THE SHORT TERM IF AVERAGING PERIOD < PERIOD OF MODULATING WAVEFORM THEN $$m \cos w_m t \rightarrow \text{constant (M)}$$

THEREFORE $$\text{Energy}_{st} = (1 + M)^2 \cos w_c t \qquad [4] \text{ (Short term average)}$$

SUBSTITUTING [3] IN [4]

$$\text{Energy}_{st} = (1 + M)^2 \, \text{Energy}_{lt} \qquad [5] \text{ (Substitution)}$$

REARRANGING $$M = \sqrt{\frac{\text{Energy}_{st}}{\text{Energy}_{lt}} - 1} \qquad [6] \text{ (Rearranging)}$$

OR WITH HIGHER DISTORTION IN SYSTEMS WITH A LOW MODULATION INDEX $m \ll 1$ $$2M = \frac{\text{Energy}_{st}}{\text{Energy}_{lt}} - 1 \qquad [7] \text{ (Simplifying)}$$

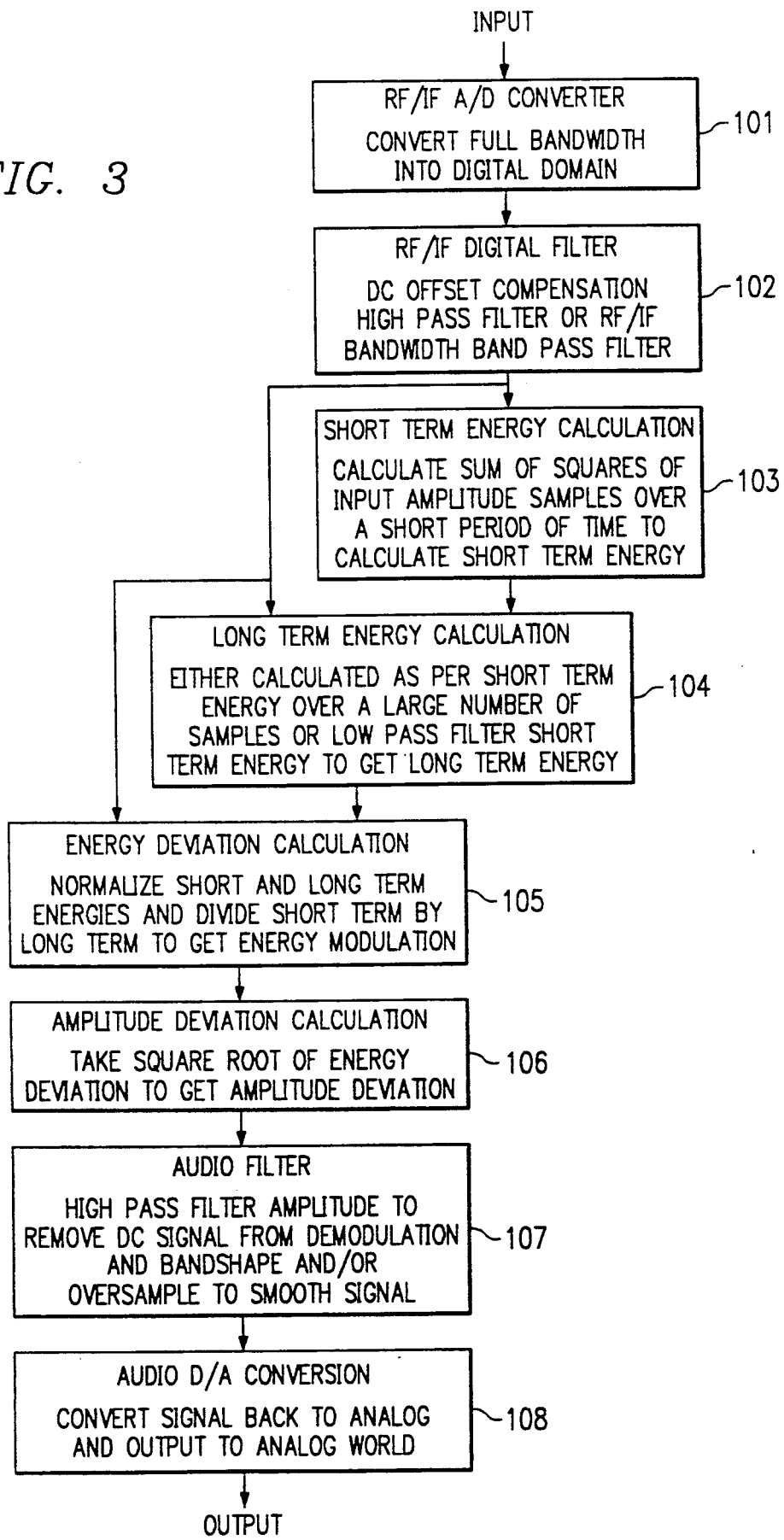

DIGITAL ANALOG SIGNAL DEMODULATOR

This application is a continuation of application Ser. No. 07/621,477, filed Dec. 3, 1990, now abandoned.

TECHNICAL FIELD OF THE INVENTION

This invention relates to the demodulation of amplitude modulated analog signals, and more particularly, to a digital signal processing technique for direct digital domain conversion of the radio frequency or intermediate frequency to the original signal.

BACKGROUND OF THE INVENTION

Typically, demodulation is performed in the analog domain by means of an analog detector circuit which detects the varying peak signal strength.

Such demodulation circuits are well-known and have served the radio wave transmission industry well since the early days of wireless radio.

As a practical matter, however, such analog demodulation circuits have problems achieving good signal recovery when the received signal is tarnished with noise or other interference.

An additional problem is that analog demodulators inherently require bulky reactance components which add size and manufacturing cost to the detection circuitry.

Thus, there is a need in the art for an arrangement which allows an analog amplitude modulated signal to be demodulated without resort to bulky circuitry.

A need also exists for such a circuit which allows for accurate demodulation in the face of low signal to noise ratios and other poorly received analog signals.

SUMMARY OF THE INVENTION

These problems have been solved by a system which accepts the input modulated input analog signal and converts the input signal into digitized samples. A calculation is then made as to both the short term and long term energy of the digitized version of the analog signal. The deviation between the short and long term energy levels is used to determine the amount of modulation of the incoming analog signal. From the digitized deviation calculations, the analog demodulated signal is then reconstructed.

One technical advantage of this system is that digital technology is employed which reduces both the cost and the size of the system and allows for remote adjustment over many different frequency ranges.

A still further technical advantage of this system is the use of digital technology for demodulating an analog signal to achieve high quality reconstructed signal in the face of low signal to noise ratios and other poorly received input signals.

BRIEF DESCRIPTION OF THE DRAWINGS

Further aspects of the invention and their advantages will be discerned by reference to the following detailed description in conjunction with the appended drawings, in which:

FIG. 1 shows in block diagram form the elements of the invention;

FIG. 2 shows a typical demodulator calculation;

FIG. 3 shows the steps required for each stage of the demodulation circuit; and

FIG. 4 shows in block diagram an alternate embodiment of a digital signal processor demodulator.

DETAILED DESCRIPTION OF THE INVENTION

The system is described with respect to FIG. 1 in which:

Circuit 101 converts the incoming analog modulator RF (Radio Frequency) or IF (Intermediate Frequency) into a sequence of digital samples. The sampling must be done at a rate exceeding the nyquist rate for the incoming RF/IF signal. The nyquist rate is twice the frequency of the incoming signal. Sampling may either be done at the nyquist rate with external phase locking to the incoming signal or at a rate sufficiently in excess of the nyquist rate to enable the RF/IF filter to achieve an equivalent function either by complex arithmetic or by feedback to this block.

Circuit 102 filters the incoming signal to the modulation bandwidth centered on the required signal. Circuit 102 filters the incoming RF or IF signal. This filter is centered on the frequency being demodulated with the same bandwidth. This filter also removes any DC component from the digitized signal to prevent any distortion in subsequent energy calculations.

Circuit 103 calculates the short term energy of the incoming data signal. Circuit 103 calculates the short term energy by a calculation of the sum of the squares of the input samples over the sampling period. Circuit 104 can similarly calculate the long term energy or this may be calculated by applying a low pass filter to the output from the short term energy filter. This must be calculated at a rate at least twice that of the maximum frequency of the final output. The maximum frequency of final output is the bandwidth of the broadcast signal being demodulated though users may wish to reduce this bandwidth under extreme adverse conditions to concentrate demodulation on the more active parts of the audio spectrum when used for audio demodulation.

Circuit 104 calculates the long term energy of the incoming data signal to determine the received level of the unmodulated signal. This should be calculated at a rate that is less than half that of the minimum frequency of the final output.

Circuit 105 calculates the energy deviation between the long and short term energy of the received waveform to determine the amount the waveform has been modulated and hence the energy of the modulating signal. This should be carried out at the same rate as that for circuit 103. The energy deviation calculation in circuit 105 is obtained by dividing the short term energy by the long term energy and then subtracting one.

Circuit 106 recalculates the amplitude of the modulating signal from the energy calculated in circuit 105.

Circuit 107 performs final waveform shaping to smooth and filter the output digital waveform.

Circuit 108 converts the output waveform back into the analog domain.

FIGS. 2 and 3 show the mathematical calculations required and the steps necessary for the various stages of the circuit.

As described in FIGS. 2 and 3, the long term energy is derived directly from the digitized samples. Another embodiment is to derive the long term energy from the short term energy by low pass filtering.

In place of the energy calculations in blocks 103 and 104 and the calculation of the amplitude deviation in block 106, the demodulator derives long term and short term averages of rectified values by converting negative digital values obtained from the converter 101 to positive digital values and then averaging the digital values over the long term and short term periods as described above. Again, the long term values could either be derived directly from the digitized samples or indirectly by low pass filtering the short term values. Using the notation employed in FIG. 2, the short term average rectified value $$\text{Rectified}_{st} = (1+M) \text{Rectified}_{Lt}$$

where $R_{Lt}$ is the long term average rectified value.

$$\text{From which } M = \frac{\text{Rectified}_{st}}{\text{Rectified}_{Lt}} - 1$$

which represents the calculation to be performed in the block 106, the block 105 forming the ratio between the values from the blocks 103 and 104.

By way of example, to decode a 9 KHz bandwidth amplitude modulated RF signal at 198 KHz, the system samples and converts the RF signal into digital form at a sampling rate of 1 MHz in circuit 101. Any sampling rate above the Nyquist rate for the incoming signal can be used. Circuit 102 then filters this sampled waveform to produce an output digital sample stream representing an 18 KHz band of data at 198 KHz. The energy in the output waveform from circuit 102 is then calculated in circuit 103 every 25 us to produce 40,000 energy samples per second. The long term energy of the output waveform from circuit 102 is then calculated every 50 ms either directly from circuit 102 or by averaging the output from circuit 103 to calculate the energy of the unmodulated waveform. The two energies calculated from circuit 103 and 104 are subtracted by circuit 105 to generate the energy of the modulating signal, from which its amplitude is calculated by circuit 106. The output from circuit 106 is then filtered and, if necessary, smoothed above the output bandwidth by oversampling to produce a digital stream for conversion back to analog form in block 108.

FIG. 4 shows one alternative embodiment of the invention in which a digital signal processor (DSP) (not shown) is used to perform some of the calculations of the conversion process. The digital signal processor can be, for example, a TMS DSP which is commercially available from Texas Instruments Incorporated and which has circuitry as described in detail in one or more of the following documents which are hereby incorporated by reference herein U.S. Pat. No. 4,577,282 issued Mar. 18, 1986; U.S. Pat. No. 4,713,748 issued Dec. 15, 1987; Pat. application Ser. No. 025,417 filed Mar. 13, 1987 (TI-11961) and now U.S. Pat. No. 4,912,636; and Pat. application Ser. No. 347,596 filed May 4, 1989 (TI-14080).

Although this description describes the invention with reference to the above specified embodiments, the claims and not this description limits the scope of the invention. Various modifications of the disclosed embodiment, as well as alternative embodiments of the invention, will become apparent to a person skilled in the art upon reference to the above description. Therefore, the appended claims will cover such modifications that fall within the true scope of the invention.

What is claimed is:

1. A system for demodulating an analog signal, said system comprising:

a sampling circuit for digitally sampling said analog signal;
   a calculation circuit for calculating both the short term and long term energy of said digital version of said analog signal;
   a calculation circuit for calculating the deviation between said short and long term energy to determine the amount of modulation of said analog signal; and
   a calculation circuit for calculating the amplitude of the modulating signal from said determined modulation amount.

2. The system set forth in claim 1 wherein said digital sampling circuit operates at a rate of twice the Nyquist rate of said analog signal.

3. The system set forth in claim 1 wherein said short term calculation circuit operates at a rate at least twice the rate of the maximum frequency of said determined modulation amount.

4. The system set forth in claim 1 wherein said long term calculation circuit operates at a rate less than half that of the minimum frequency of said determined modulation amount.

5. The system set forth in claim 1 wherein said deviation calculation circuit operates at a rate at least twice the rate of the maximum frequency of said determined modulation amount.

6. The system set forth in claim 1 wherein said amplitude calculation circuit includes:
   circuitry for smoothing and filtering the digital output from said deviation calculating circuit; and
   circuitry for converting said smoothed and filtered digital signal into a demodulated analog signal.

7. A method for demodulating an analog signal, said method comprising the steps of:
   digitally sampling said analog signal;
   calculating both the short term and long term energy of said digital samples of said analog signal,
   calculating the deviation between said short and long term energy to determine the amount of modulation of said analog signal; and
   reconstructing the amplitude of the modulating signal from said determined modulation amount.

8. The method set forth in claim 7 wherein said digital sampling step operates at a rate of twice the Nyquist rate of said analog signal.

9. The method set forth in claim 7 wherein said short term calculation step operates at a rate at least twice the rate of the maximum frequency of said determined modulation amount.

10. The method set forth in claim 7 wherein said long term calculation step operates at a rate less than half that of the minimum frequency of said determined modulation amount.

11. The method set forth in claim 7 wherein said deviation calculation step operates at a rate at least twice the rate of the maximum frequency of said determined modulation amount.

12. The method set forth in claim 7 wherein said amplitude reconstruction step includes the steps of:
   smoothing and filtering the digital output from said deviation calculating circuit; and
   converting said smoothed and filtered digital signal into a demodulated analog signal.

13. A broadcast wave receiver including a system for demodulating an input RF signal, said receiver comprising:

a sampling circuit for digitally sampling received broadcast modulated signals;

a calculation circuit for calculating both the short term and long term energy of said digital version of said received RF signals;

a calculation circuit for calculating the deviation between said short and long term energy to determine the amount of modulation of said received RF signals; and a calculation circuit for calculating the amplitude of the modulating signal from said determined modulation amount.

14. The receiver set forth in claim 13 wherein said amplitude calculation circuit includes:

circuitry for smoothing and filtering the digital output from said deviation calculating circuit; and circuitry for converting said smoothed and filtered digital signal into a demodulated analog signal.

15. The method of demodulating a signal, said method comprising the steps of:

converting the modulated signal bandwidth into digital samples;

storing said digital samples in a processor;

calculating under control of said processor, from said stored samples, from time to time, the short term and long term energy of said stored samples;

calculating from said short term and long term energies the deviation therebetween; and deriving from said deviation the amplitude of the modulating signal of said modulated signal.

16. The method set forth in claim 15 wherein said calculating steps includes the step of:

waiting for periods of time between calculations until a certain number of digital samples are stored in said processor.

17. The method set forth in claim 16 wherein said digital samples are derived at a rate twice the Nyquist rate of said modulated signal.

18. The method set forth in claim 15 further comprising the step of:

converting said derived amplitude to an analog signal.

19. The processor system of demodulating a signal, said system comprising:

circuitry for converting the modulated signal bandwidth into digital samples;

circuitry for storing said digital samples in a processor;

processor logic for calculating from said stored samples, from time to time, the short term and long term energy of said stored samples and for calculating from said short term and long term energies the deviation therebetween; and processor logic for deriving from said deviation the amplitude of the modulating signal of said modulated signal.

20. The system set forth in claim 19 wherein said digital samples are derived at a rate twice the Nyquist rate of said modulated signal.

21. The system set forth in claim 19 further comprising circuitry for converting said derived amplitude to an analog signal.

* * * * *